United States Patent
Otsuka et al.

(10) Patent No.: US 10,943,170 B2
(45) Date of Patent: Mar. 9, 2021

(54) NEURAL NETWORK CIRCUIT

(71) Applicant: DENSO CORPORATION, Kariya (JP)

(72) Inventors: Shigeki Otsuka, Kariya (JP); Hironobu Akita, Kariya (JP); Irina Kataeva, Kariya (JP)

(73) Assignee: DENSO CORPORATION, Kariya (JP)

( * ) Notice: Subject to any disclaimer, the term of this patent is extended or adjusted under 35 U.S.C. 154(b) by 249 days.

(21) Appl. No.: 16/249,190

(22) Filed: Jan. 16, 2019

(65) Prior Publication Data

US 2019/0147330 A1    May 16, 2019

Related U.S. Application Data

(63) Continuation of application No. PCT/JP2017/019370, filed on May 24, 2017.

(30) Foreign Application Priority Data

Jul. 20, 2016 (JP) .............................. JP2016-142445

(51) Int. Cl.
| | |
|---|---|
| *G06N 3/06* | (2006.01) |
| *G06N 3/063* | (2006.01) |
| *G11C 11/54* | (2006.01) |
| *G11C 13/00* | (2006.01) |

(52) U.S. Cl.
CPC ........... *G06N 3/0635* (2013.01); *G06N 3/063* (2013.01); *G11C 11/54* (2013.01); *G11C 13/004* (2013.01); *G11C 13/0069* (2013.01); *G11C 13/0097* (2013.01); *G11C 13/0007* (2013.01); *G11C 2013/005* (2013.01); *G11C 2013/009* (2013.01); *G11C 2013/0073* (2013.01); *G11C 2013/0088* (2013.01); *G11C 2213/77* (2013.01)

(58) Field of Classification Search
None
See application file for complete search history.

(56) References Cited

U.S. PATENT DOCUMENTS

| | | | |
|---|---|---|---|
| 6,490,190 B1 | 12/2002 | Ramcke et al. | |
| 8,416,609 B2* | 4/2013 | Meade | G11C 13/0061 365/149 |
| 2009/0010039 A1 | 1/2009 | Tokiwa et al. | |
| 2009/0046495 A1 | 2/2009 | Shimaoka et al. | |
| 2011/0182104 A1* | 7/2011 | Kim | G11C 11/5685 365/148 |
| 2014/0129498 A1 | 5/2014 | Bichler et al. | |

OTHER PUBLICATIONS

Xiaoxiao Liu et al., "A Heterogeneous Computing System with Memristor-Based Neuromorphic Accelerators," IEEE, 2014.

(Continued)

*Primary Examiner* — Tan T. Nguyen
(74) *Attorney, Agent, or Firm* — Posz Law Group, PLC

(57) ABSTRACT

A neural network circuit includes: a storage part that includes memristors in a lattice shape; a voltage application circuit that applies a bias voltage to the storage part; a controller that controls the voltage application circuit to perform to a selection element, writing, erasing, or reading; and multiple conversion amplification circuits that convert a current flowing into a voltage, and output the voltage.

6 Claims, 11 Drawing Sheets

(56) References Cited

OTHER PUBLICATIONS

Fabian Alibart et al., "High-Precision Tuning of State for Memristive Devices by Adaptable Variation-Tolerant Algorithm," University of California Santa Barbara, 2012.
Yi-Chou Chen et al., "An Access-Transistor-Free (OT/1R) Non-Volatile Resistance Random Access Memory (RRAM) Using a Novel Threshold Switching, Self-Rectifying Chalcogenide Device," IEEE, 2003.
F. Merrikh Bayat et al., "Phenomenological modeling of memristive devices," Applied Physics A, 2015. (Discussed on p. 5 of the specification).

\* cited by examiner

NEURAL NETWORK CIRCUIT

CROSS REFERENCE TO RELATED APPLICATIONS

The present application is a continuation application of International Patent Application No. PCT/JP2017/019370 filed on May 24, 2017, which designated the U.S. and claims the benefit of priority from Japanese Patent Application No. 2016-142445 filed on Jul. 20, 2016. The entire disclosures of all of the above applications are incorporated herein by reference.

TECHNICAL FIELD

The present disclosure relates to a neural network circuit.

BACKGROUND

A neural network circuit includes an element having two terminals as a synapse, the element being nonvolatile and capable of varying a conductance value and being referred to as a memristor.

SUMMARY

The present disclosure provides a neural network circuit including: a storage part that includes memristors connected in a lattice shape; a voltage application circuit; and a controller. The voltage application circuit is configured to apply a bias voltage to the storage part. The controller is configured to control the voltage application circuit to perform to the selection element, at least one of writing, erasing, or reading of the data. The controller varies the bias voltage applied through the voltage application circuit.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 10:
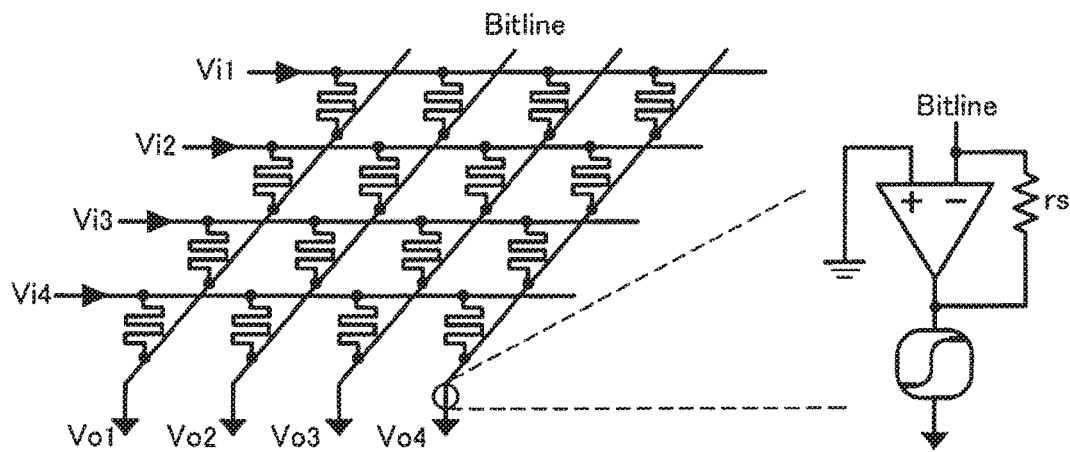
FIG. 10 is a diagram showing a first comparative example.

A neural network circuit includes a two-terminal element as a synapse, the two-terminal element being nonvolatile and capable of varying a conductance value. The two-terminal element is called as a memristor. In the neural network as shown in FIG. 10 corresponding to a first comparative example, the memristor is arranged in a lattice shape. A voltage is applied to the memristor, and a current is generated. A composite current is converted into a voltage by a transimpedance amplifier. A waveform of the voltage is shaped by an activation function. The voltage is output as a voltage value. The memristor operates as a synapse, and the transimpedance amplifier operates as a neuron. Thereby, the neural network circuit is configured. The transimpedance amplifier performs a product-sum operation of the conductance value of the memristor with the applied voltage.

Figure 11:
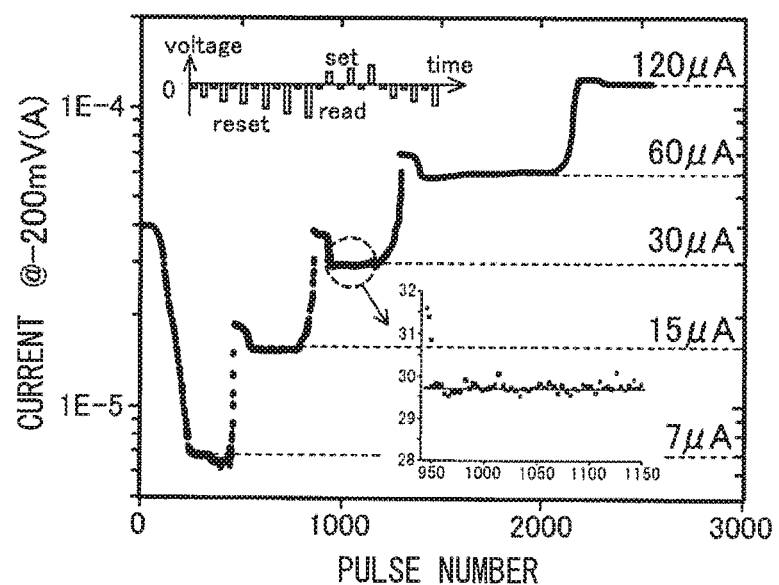
FIG. 11 is a diagram showing a second comparative example.

As shown in FIG. 11 corresponding to a second comparative example, in order to reduce the conductance value of the memristor having bipolar characteristics, an erasing voltage is applied to both ends of the memristor. In order to measure the varied conductance value, a reading voltage is applied to the memristor. Thereby, the current value is read. Until the desired conductance value is reached, processes repeat with varying the erasing voltage. In order to increase the conductance value, a writing voltage is applied to the memristor. Thereby, it may be possible to set an arbitrary conductance value in the memristor corresponding to each of the combinations of the writing, the erasing, and the reading.

Figure 12:
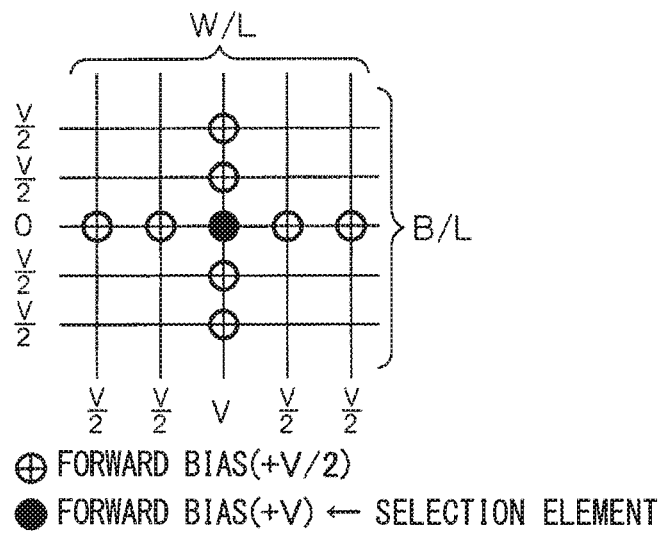
FIG. 12 is a diagram showing a third comparative example.
Figure 13:
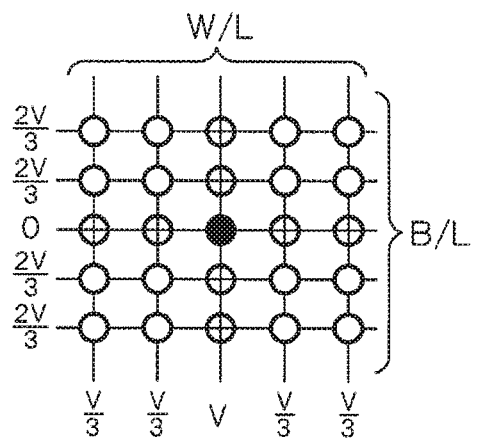
FIG. 13 is a diagram showing a fourth comparative example.

When the voltage is applied in a case of employing the memristor including the switch or the selector, it may be possible to arbitrarily set an accurate conductance value. However, when the memristor that does not include the switch and the selector is arranged in the lattice shape, "disturbance" affects the conductance value of the unselection element (also referred to as a non-selection element). For example, a bias method is proposed as shown in FIG. 12 corresponding to a third comparative example and FIG. 13 corresponding to a fourth comparative example. In order to perform the writing and the erasing to the memristor having the bipolar characteristics, when a voltage V is applied to both ends of the selection element, a voltage V/2 and a voltage V/3 are applied to the unselection element. The selection target corresponds to a memristor targeted for the writing, the reading, or the erasing. The unselection element corresponds to a memristor untargeted for the writing, the reading, or the erasing.

According to the configurations of the third comparative example and the fourth comparative example, a ReRAM (resistive random access memory, registered trademark) stores data by setting binary values of high resistance and low resistance. However, in the neural network circuit requiring setting the arbitrary analog values with high accuracy, it may be required that the voltage applied to the unselection element may be reduced as low as possible.

Figure 1:
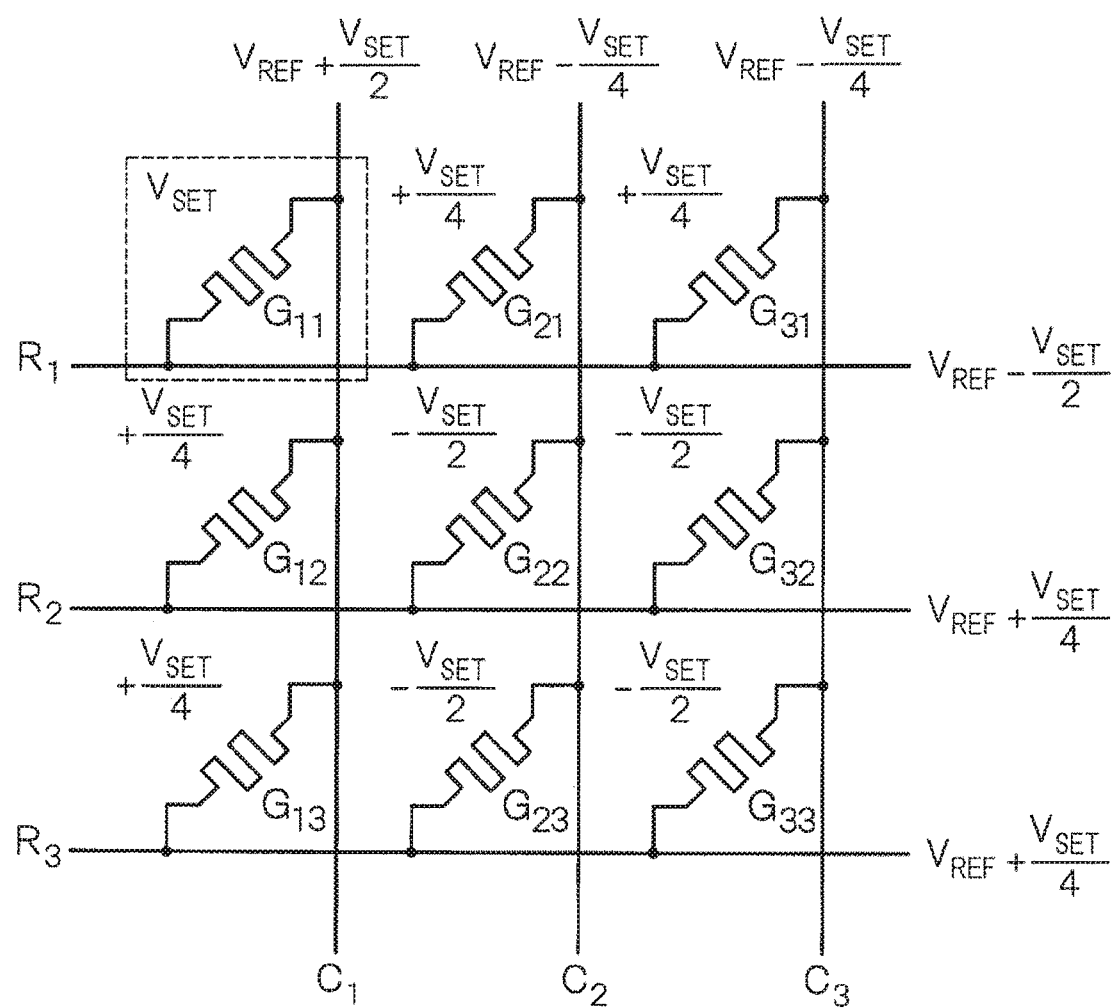
FIG. 1 is a view illustrating a state of applying of a bias voltage to perform writing in a selection element of memristors.
Figure 2:
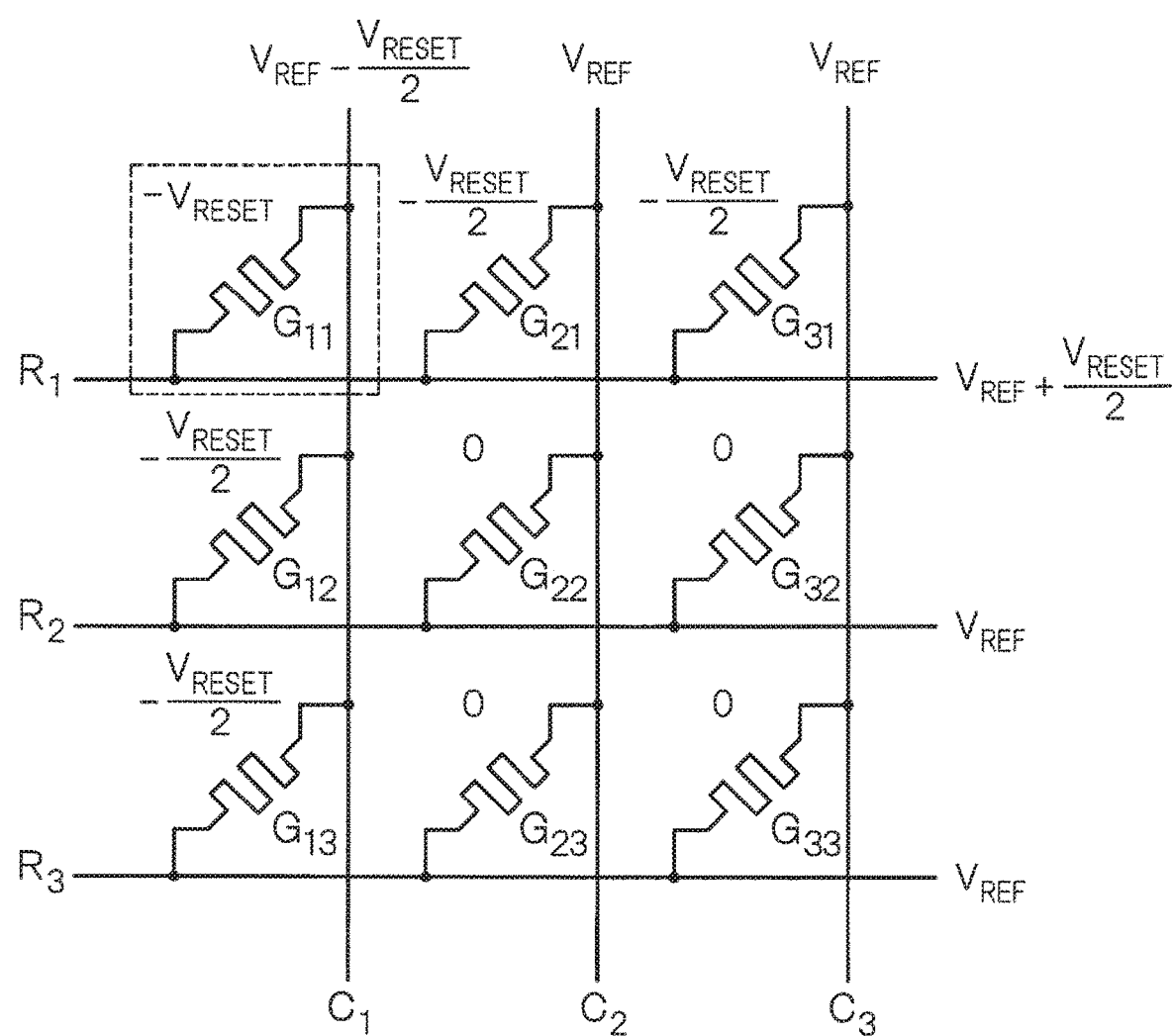
FIG. 2 is a view illustrating a state of the applying of a bias voltage to perform erasing of the selection element.
Figure 3:
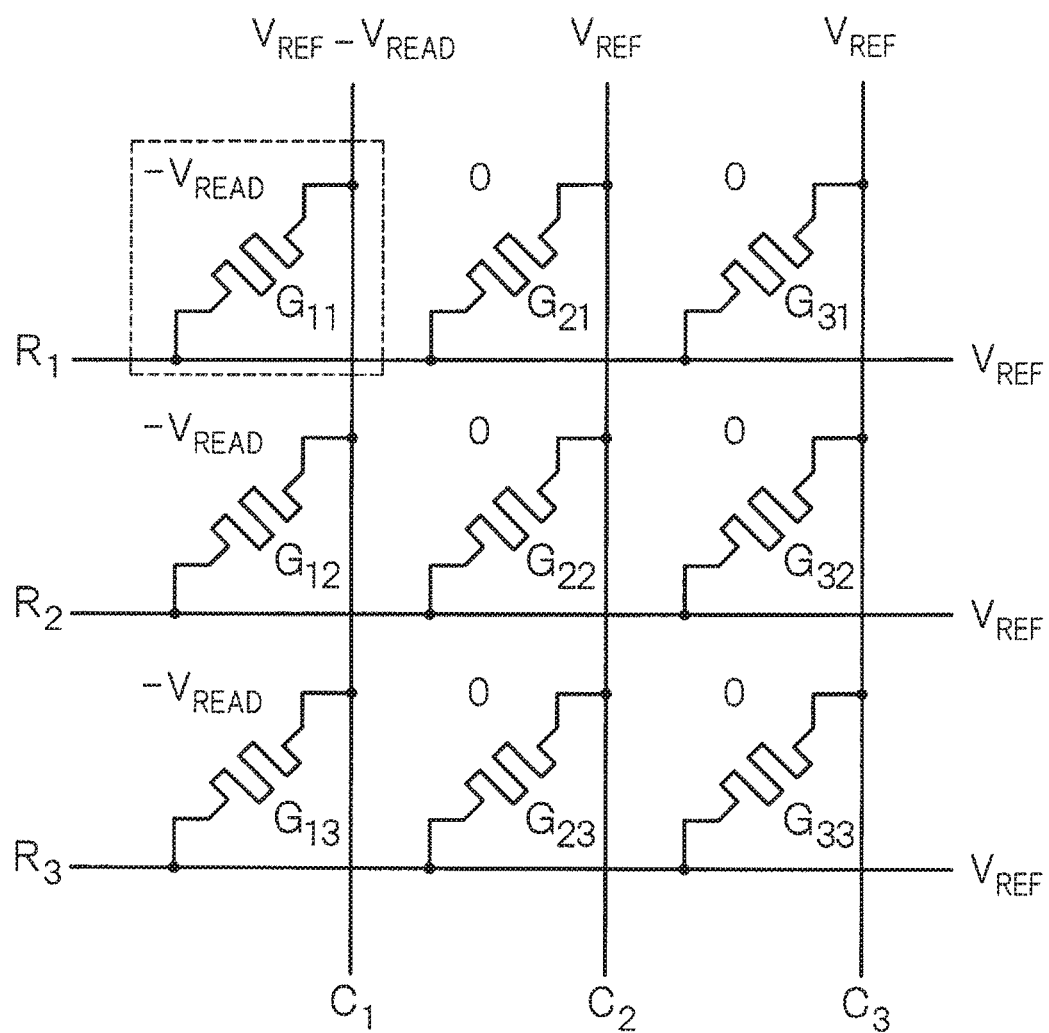
FIG. 3 is a view illustrating a state of the applying of a bias voltage to perform reading from the selection element.

One embodiment according to the present disclosure will be described. According to the embodiment, it is described for operation of applying the bias voltage at when performing the writing, the erasing, and the reading to the memristor. FIG. 1 to FIG. 3 show a 3×3 memristor array also called a crossbar as one example. Lines $R_1$ to $R_3$ aligned in a row direction and lines $C_1$ to $C_3$ aligned in a column direction are arranged so as to cross each other. Memristors $G_{11}$ to $G_{33}$ as a memory element (also referred to as a storage element) are arranged corresponding to lattice points at which two of the lines cross. A first end (also referred to as one end) of each of memristors $G_{11}$ to $G_{33}$ is connected with each of the lines $C_1$ to $C_3$. A second end (also referred to as the other end) of each of the memristors $G_{11}$ to $G_{33}$ is connected with each of the lines $R_1$ to $R_3$. According to the embodiment, a side of a line C may be referred to as a first end side, and a side of a line R may be referred to as a second end side. As a precondition, the memristor employed in the embodiment is a variable resistance element having the bipolar characteristics.

As shown in FIG. 1, a writing voltage $V_{SET}$ at a normal bias is applied to both ends of the memristor $G_{11}$ surrounded by a broken line in order to write and set the memristor $G_{11}$ as the selection element. When a reference voltage is $V_{REF}$, the voltages are applied to the line $C_1$ and the Line $R_1$ respectively, as following:

Line $C_1$: $V_{REF}+V_{SET}/2$; and
Line $R_1$: $V_{REF}-V_{SET}/2$.

Then, the voltages are applied to the lines $C_2$ and $C_3$, $R_2$ and $R_3$ other than the line $C_1$ and the line $R_1$, respectively, as following:

Lines $C_2$ and $C_3$: $V_{REF}-V_{SET}/4$; and
Lines $R_2$ and $R_3$: $V_{REF}+V_{SET}/4$.

The first ends of the memristors corresponding to unselection elements $G_{12}$ and $G_{13}$ are commonly connected with the memristor $G_{11}$ through the line $C_1$. A voltage $V_{SET}/4$ is applied to both ends of the memristors $G_{12}$ and $G_{13}$ corresponding to the unselection elements. The second ends of the memristor corresponding to the unselection elements $G_{21}$ and $G_{31}$ are commonly connected with the memristor $G_{11}$ through the line $R_1$. Similarly, the voltage $W_{SET}/4$ is applied to both ends of the memristors $G_{21}$ and $G_{31}$ corresponding to the unselection elements. A voltage $-V_{SET}/2$ is applied to both ends of the memristor $G_{22}$, $G_{23}$, $G_{32}$, and $G_{33}$, which are the other unselection elements.

The bias voltage $V_{SET}/4$ applied to a part of the unselection elements becomes lower than the bias voltages of the third comparative example and the fourth comparative example. Therefore, it may be possible to further reduce the influence of disturbance (also referred to as disturb). In addition, the bias voltage $-V_{SET}/2$ applied to a part of the other unselection elements becomes an inversion bias. Therefore, it may be possible to ignore the influence of the disturbance. A detailed theory is described in a non-patent literature ("Phenomenological Modeling of Memristic Devices" Applied Physics A, vol. 118, pp. 770-786, 2015).

As shown in FIG. 2, an erasing voltage $V_{RESET}$ at the inversion bias is applied to both ends of the memristor $G_{11}$ when erasing and resetting the memristor $G_{11}$ corresponding to the selection element. Therefore, voltages are applied to the lines $C_1$ and $R_1$, respectively as following:

Line $C_1$: $V_{REF}-V_{REST}/2$; and
Line $R_1$: $V_{REF}+V_{RESET}/2$.

The reference voltage $V_{REF}$ is applied to the other lines $C_2$ and $C_3$, $R_2$ and $R_3$, respectively.

Thereby, the "bias voltage" $-V_{RESET}/2$ is applied to both ends of the memristors $G_{12}$, $G_{13}$, $G_{21}$, and $G_{31}$ corresponding to the unselection elements. Since the bias voltage $-V_{RESET}/2$ is inversion bias, it may be possible to ignore the influence of the disturbance. The bias voltage is not applied to both ends of the other memristor $G_{22}$, $G_{23}$, $G_{32}$, and $G_{33}$ corresponding to the unselection elements. Therefore, the disturbance does not occur.

As shown in FIG. 3, similarly, a reading voltage $V_{READ}$ at the inversion bias is applied to both ends of the memristor $G_{11}$ when reading the memristor $G_{11}$ as the selection element. Therefore, the voltage is applied to the line $C_1$ as following;

Line $C_1$: $V_{REF}-V_{READ}$.

The reference voltage $V_{REF}$ is applied to the other lines $C_2$ and $C_3$, $R_1$ to $R_3$, respectively.

Thereby, the bias voltage $-V_{READ}$ is applied to both ends of the memristors $G_{12}$ and $G_{13}$ corresponding to the unselection element. However, it may be possible to ignore the influence of the disturbance since the bias voltage becomes the inversion bias. The bias voltage is not applied to both ends of the other memristors $G_{21}$ to $G_{23}$, and $G_{31}$ to $G_{33}$ corresponding to the unselection elements. Therefore, the disturbance does not occur.

Figure 4:
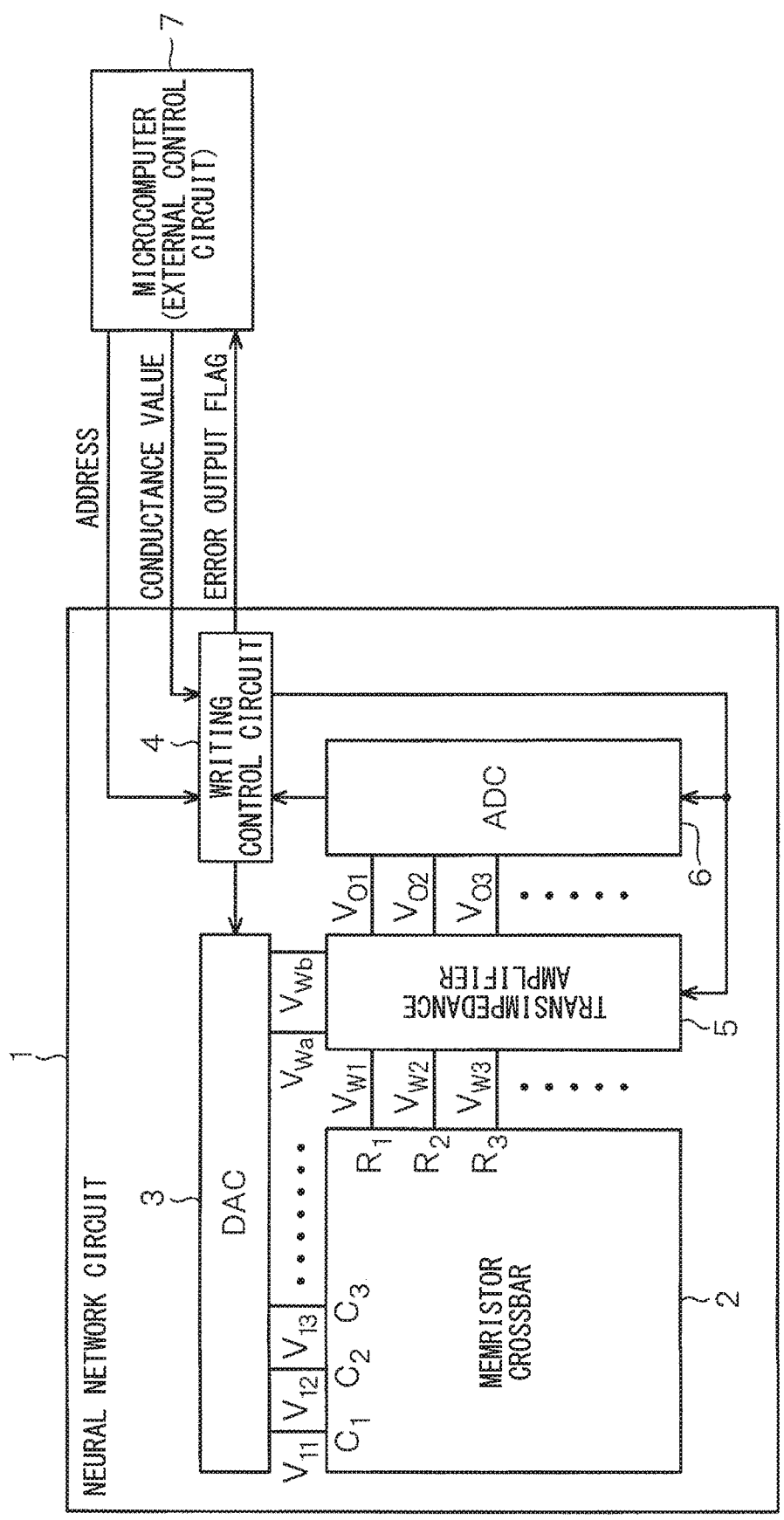
FIG. 4 is a functional block diagram showing a configuration of a neural network circuit.

Next, a specific configuration for applying each bias voltage will be described. As shown in FIG. 4, a neural network circuit 1 according to the embodiment includes a crossbar 2 having the memristor arranged in a lattice shape as a storage part, similarly to FIG. 1. A DAC 3 that is a D/A converter outputs analog voltages corresponding to data input from a writing control circuit 4. The voltages are applied to the lines R and C of the crossbar 2. The DAC 3 corresponds to a voltage applying part or a voltage application circuit. The writing control part corresponds to a controller.

The line R of the crossbar 2 is connected with an input terminal of a transimpedance amplifier 5. The transimpedance amplifier 5 converts current flowing through the line R of the crossbar 2 into a voltage in performing the reading. The transimpedance amplifier 5 inputs the voltage to an ADC 6 that is an A/D converter. The ADC 6 converts an input voltage into digital data, and inputs the digital data to the writing control circuit 4. The transimpedance amplifier 5 corresponds to an I/V conversion amplification circuit or a conversion amplification circuit.

The writing control circuit 4 is connected with a microcomputer 7 (or an external control circuit 7) outside the neural network circuit 1. The microcomputer 7 inputs an address and the conductance value of the crossbar 2 to the writing control circuit 4 in order to control the bias voltage applied to the crossbar 2. The writing control circuit 4 inputs the data of the applying voltage corresponding to the address to the DAC 3. The writing control circuit 4 transmits the control signal corresponding to the address to the transimpedance amplifier 5.

The writing control circuit 4 does not operate the ADC 6 in performing the writing of the data and the erasing of the data. The writing control circuit 4 operates the ADC 6 corresponding to the address only in performing the reading. The writing control circuit 4 reads the data. Then, the writing control circuit 4 compares the read data of the ADC 6 with the conductance value input from the microcomputer 7. The writing control circuit 4 performs the writing, the erasing, and the reading again. When the read data of the ADC 6 and the conductance value received from the microcomputer 7 do not match each other, or when the read data of the ADC 6 and the conductance value input from the microcomputer 7 are outside an acceptable error range, the writing control circuit 4 increases the erasing voltage $V_{RSET}$, and performs the writing, the erasing, and the reading again.

Based on a result of comparison, when the read data of the ADC 6 and the conductance value input from the microcomputer 7 match each other, or when the read data of the ADC 6 and the conductance value input from the microcomputer 7 are inside the acceptable error range, the writing control circuit 4 inverts an error output flag input to the microcomputer 7. When recognizing inversion of the error output flag, the microcomputer 7 transmits the next address and the next conductance value to the writing control circuit 4. The neural network circuit 1 may include the microcomputer 7.

Figure 5:
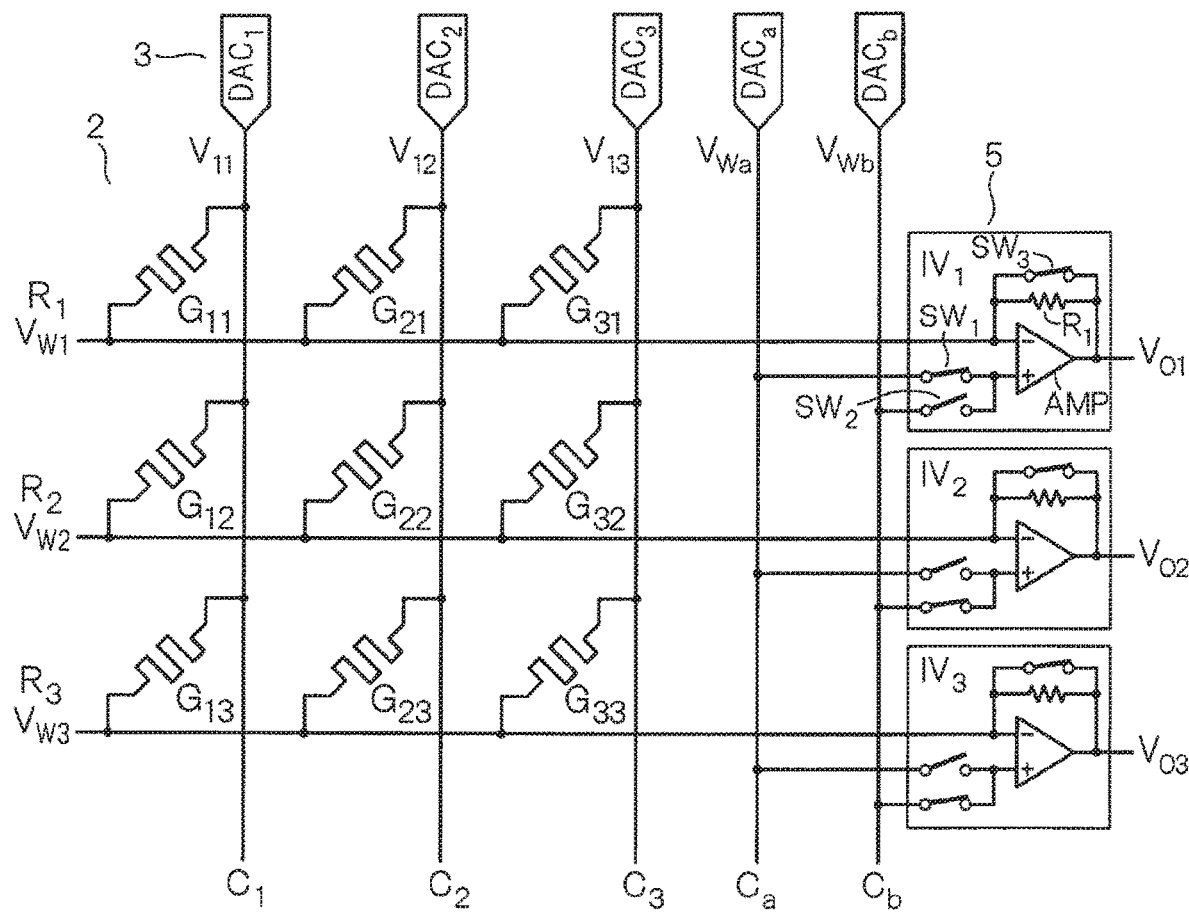
FIG. 5 is a view illustrating an on/off state of each switch at the applying of the bias voltage to perform the writing in the selection element.

Next, an operation of the embodiment will be described. An operation in performing the writing will be described. As shown in FIG. 5, the crossbar 2 is the 3×3 memristor array, and the selection element is the memristor $G_{11}$, similarly to FIG. 1 or the like. Each of $DAC_1$ to $DAC_3$ is a part of the DAC 3. Each of $DAC_1$ to $DAC_3$ is connected with each of the lines $C_1$ to $C_3$. Each of lines $IV_1$ to $IV_3$ is a part of the transimpedance amplifier 5. Each of $IV_1$ to $IV_3$ is connected with each of the lines $R_1$ to $R_3$. A $DAC_a$ and a $DAC_b$ are also a part of the DAC 3. Each of the non-inversion input terminals of the amplifiers $IV_1$ to $IV_3$ is connected with the output terminals of the $DAC_a$ and the $DAC_b$ through the switches $SW_1$ and $SW_2$ and the lines $C_a$ and $C_b$. Between the non-inversion input terminal and the output terminal of each of the amplifiers $IV_1$ to $IV_3$, a parallel circuit of a feedback resistor $R_f$ with a switch $SW_3$ is connected.

When the writing voltage $V_{SET}$ is applied to the memristor $G_{11}$, the feedback resistor $R_f$ of each of the amplifiers $IV_1$ to $IV_3$ is short-circuited by the switch $SW_3$. Thereby, the switch $SW_3$ operates as a voltage follower. In order to set the voltage of the line $R_1$ to an output voltage $V_{wa}$ of the $DAC_a$, the switch $SW_1$ of the amplifier $IV_1$ is short-circuited, and the switch $SW_2$ is opened. In order to set the voltages of the lines $R_2$ and $R_3$ to the output voltage $V_{wb}$ of the $DAC_b$, the switches $SW_1$ of the other amplifiers $IV_2$ and $IV_3$ are opened, and the switch $SW_2$ is short-circuited.

In a state as shown in FIG. 5, the output voltage $V_{wa}$ of $DAC_a$ is set to a voltage $(V_{REF}-V_{SET}/2)$, and the output voltage $V_{wb}$ of $DAC_b$ is set to a voltage $(V_{REF}+V_{SET}/4)$. Thereby, as shown in FIG. 1, each bias voltage corresponding to the time of the writing is applied.

Figure 6:
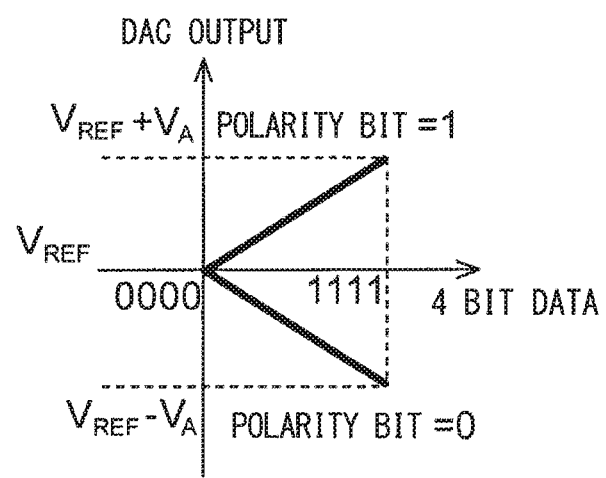
FIG. 6 is a diagram showing characteristics of a DAC having polarity bits.
Figure 7:
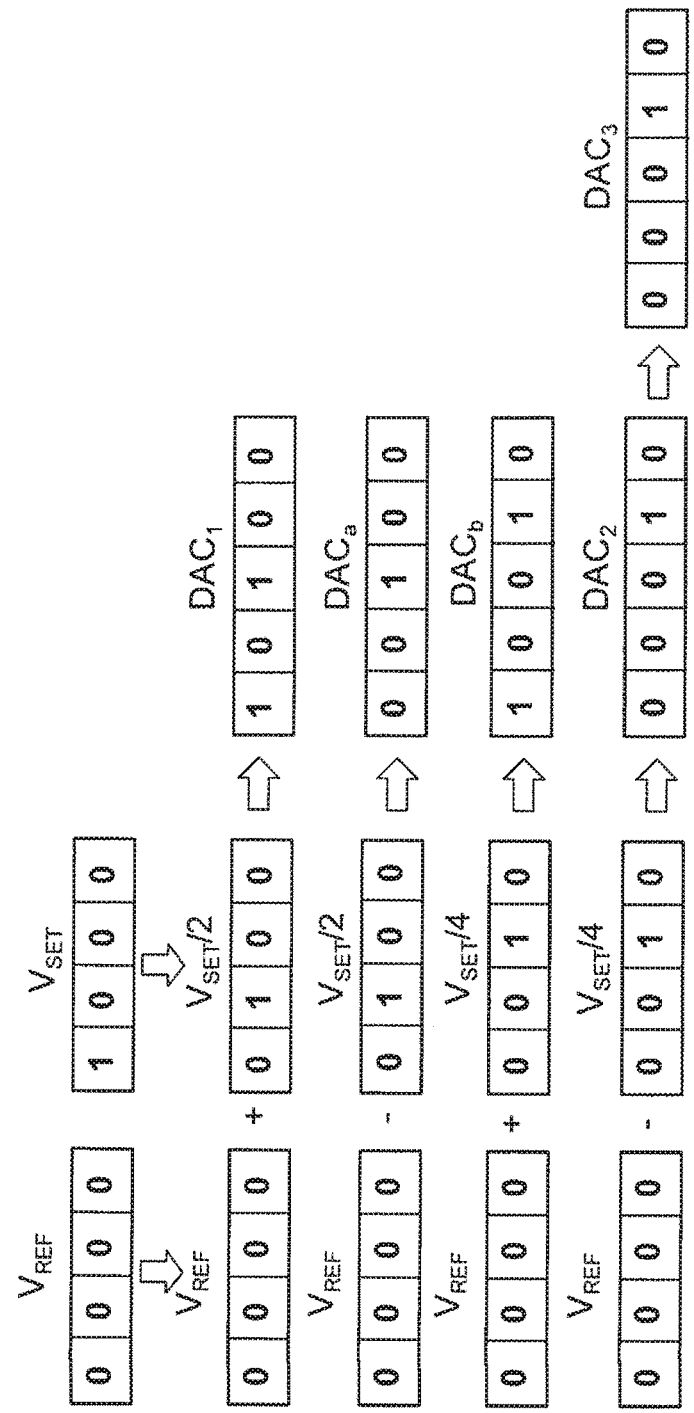
FIG. 7 is a diagram showing a generation state of data input to each DAC.

As shown in FIG. 6, the DAC 3 has a 5-bit configuration in which MSB (most significant bit) includes a polarity bit. When the reference voltage $V_{REF}$ is output with 4-bit data "0000" and the writing voltage $V_{SET}$ is output with the data "1000", it may be possible to generate each bias voltage applied in performing the writing shown in FIG. 1, by only barrel shifting any data input to the DAC 3, as shown in FIG. 7. Relations between the voltage $V_{SET}$ and the bit date are described as following:
+$V_{SET}/2 \rightarrow$"10100";
−$V_{SET}/2 \rightarrow$"00100";
+$V_{SET}/4 \rightarrow$"10010"; and
−$V_{SET}/4 \rightarrow$"00010".

Therefore, the data input to $DAC_1$ to $DAC_3$, $DAC_a$ and $DAC_b$ are described as following:
$DAC_1 \leftarrow$"10100";
$DAC_2 \leftarrow$"00010";
$DAC_3 \leftarrow$"00010";
$DAC_a \leftarrow$"00100"; and
$DAC_b \leftarrow$"10010".

Figure 8:
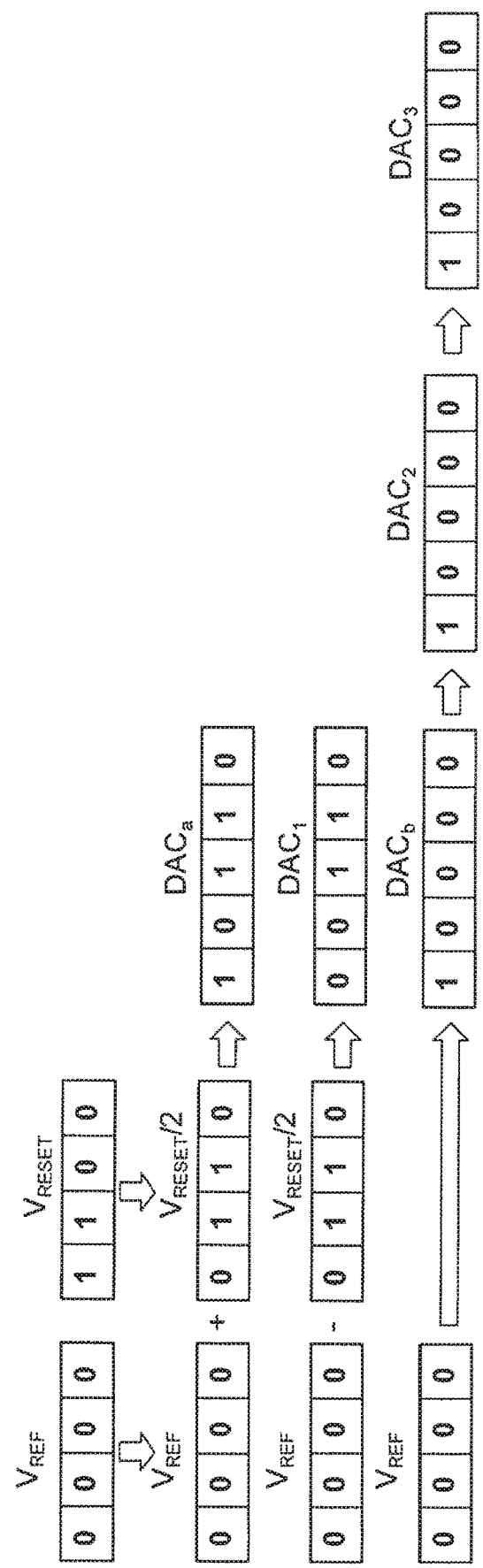
FIG. 8 is a diagram showing a generation state of data input to each DAC at the erasing of the selected element.

An operation in performing the erasing will be described. An on/off setting of the switches $SW_1$ and $SW_2$ is similar to FIG. 5. When the reference voltage $V_{REF}$ is output with 4-bit data "0000" and the erasing voltage $V_{RESET}$ is output with the data "1100", it may be possible to generate each bias voltage applied in performing the erasing shown in FIG. 2, by only barrel shifting any data input to the DAC 3, as shown in FIG. 8. Relations between the voltage $V_{RESET}$ and the bit date are described as following:
+$V_{SET}/2 \rightarrow$"10110"; and
−$V_{SET}/2 \rightarrow$"00110".

Therefore, the data input to $DAC_1$ to $DAC_3$, $DAC_a$ and $DAC_b$ is described as following:
$DAC_1 \leftarrow$"00110";
$DAC_2 \leftarrow$"10000";
$DAC_3 \leftarrow$"10000";
$DAC_a \leftarrow$"10110"; and
$DAC_b \leftarrow$"10000".

Figure 9:
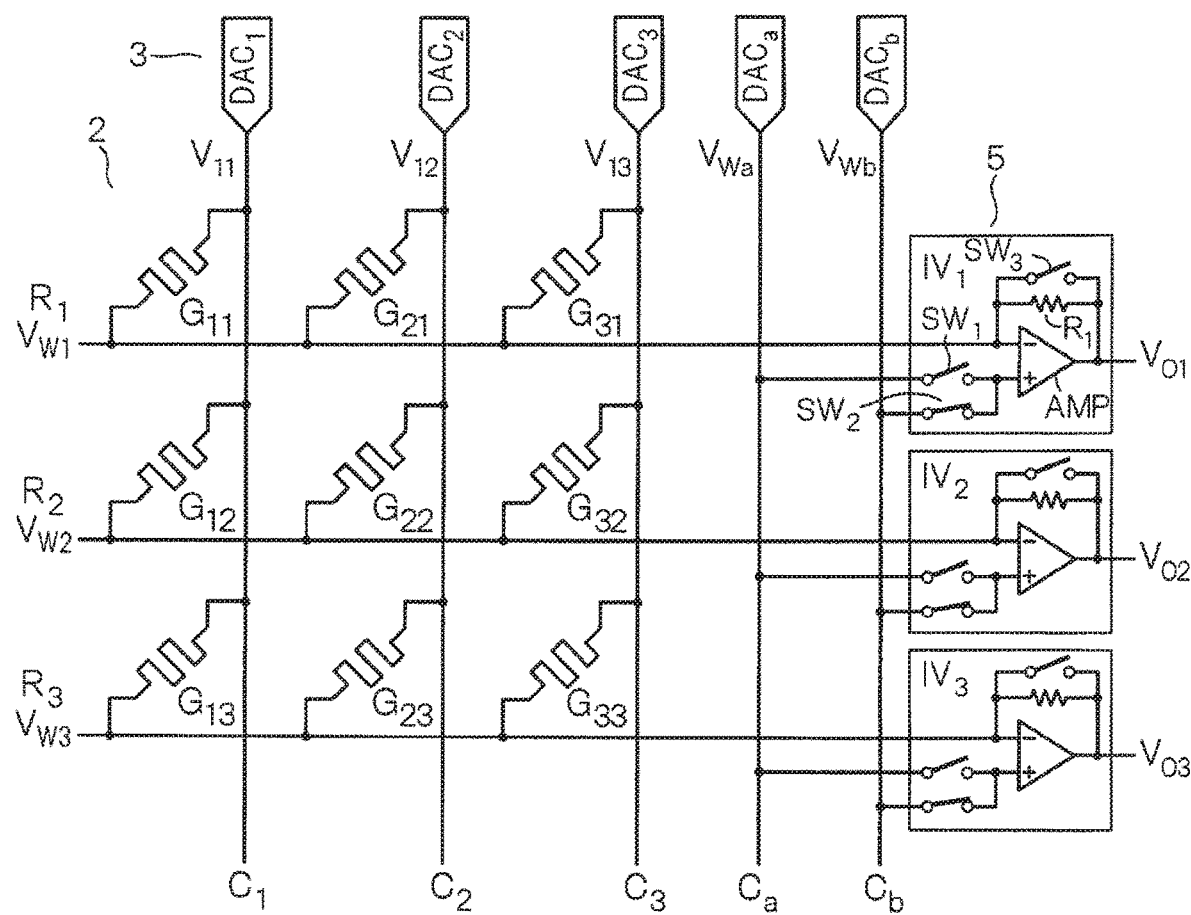
FIG. 9 is a view illustrating an on/off state of each switch at the applying of the bias voltage to perform the reading from the selected element.

An operation in performing the reading will be described. After the writing or the erasing for the selection element, the reading is performed in order to confirm whether the conductance value is a predetermined value. Therefore, as shown in FIG. 9, by opening all the switches $SW_3$ of each of the amplifiers $IV_1$ to $IV_3$, the switches $SW_3$ operates as the transimpedance amplifier. Each of the switches $SW_1$ is opened, and each of the switches $SW_2$ is short-circuited.

In a state as shown in FIG. 9, the output voltage $V_{11}$ of $DAC_1$ is set to $(V_{REF}-V_{READ})$, and each of the output voltages of the other $DAC_b$ is set to the reference voltage $V_{REF}$. Thereby, as shown in FIG. 3, each bias voltage corresponding to the time of the reading is applied.

According to the embodiment, the neural network circuit 1 includes the crossbar 2 that is a storage part formed by connecting the memristors $G_{11}$ to $G_{33}$ in the lattice shape. The writing control circuit 4 reduces the resistance value as data for the selection element of the crossbar 2. That is, the conductance value reduces when performing the writing. The writing control circuit 4 increases the resistance value as data for the selection element of the crossbar 2. That is, the conductance value increases when performing the erasing and the reading. When controlling the DAC 3 in order to perform the writing, the erasing and the reading, the writing control circuit 4 varies the bias voltage applied through the DAC 3 corresponding to each of the writing, the erasing and the reading, so as to reduce the disturbance to the unselection element. According the configuration, it may be possible to reduce the disturbance to the unselection element by optimizing each of the applied bias voltages in performing at least one of the writing, the erasing, or the reading to the selection element.

Specifically, when writing the data, the writing control circuit 4 applies a voltage $(V_{REF}+V_{SET}/2)$ to the line $C_1$ connected with the first end of the selection element $G_{11}$. The writing control circuit 4 applies a voltage $(V_{REF}-V_{SET}/2)$ to the line $R_1$ connected with the second end. The writing control circuit 4 applies a voltage $(V_{REF}-V_{SET}/4)$ to the other lines $C_2$ and $C_3$. The writing control circuit 4 applies a voltage $(V_{REF}+V_{SET}/4)$ to the lines $R_2$ and $R_3$.

Thereby, the voltage $V_{SET}/4$ is applied to both ends of the unselection elements $G_{12}$, $G_{13}$, $G_{21}$ and $G_{31}$. The voltage −$V_{SET}/2$ is applied to both ends of the unselection elements $G_{22}$, $G_{23}$, $G_{32}$ and $G_{33}$. The bias voltage $V_{SET}/4$ becomes lower than the bias voltage according to the comparative examples 3 and 4. Thereby, it may be possible to further reduce the influence of the disturbance. The bias voltage −$V_{SET}/2$ applied to a part of the other unselection elements becomes the inversion bias. Therefore, it may be possible to ignore the influence of the disturbance.

When erasing the data, the writing control circuit 4 applies a voltage $(V_{REF}-V_{RESET}/2)$ to the line $C_1$ to which the first end of the selection element G11 is connected. The writing control circuit 4 applies a voltage $(V_{REF}+V_{RESET}/2)$ to the line $R_1$ connected with the second end. The writing control circuit 4 applies the reference voltage $V_{REF}$ to each of the other lines.

Thereby, the bias voltage −$V_{RESET}/2$ is applied to both ends of the unselection elements $G_{12}$, $G_{13}$, $G_{21}$, and $G_{31}$.

However, the bias voltage is $-V_{RESET}/2$. Therefore, it may be possible to ignore the influence of the disturbance. The bias voltage is not applied to both ends of the other unselection elements $G_{22}$, $G_{23}$, $G_{32}$, and $G_{33}$. Therefore, the disturbance does not occur.

When reading the data, the writing control circuit 4 applies a voltage ($V_{REF}-V_{READ}$) to the line $C_1$ connected with the first end of the selection element $G_{11}$. The writing control circuit 4 applies a voltage ($V_{REF}+V_{RESET}/2$) to the line R 1 connected with the second end. The writing control circuit 4 applies the reference voltage $V_{REF}$ to each of the other lines. Thereby, the bias voltage $-V_{READ}$ is applied to both ends of the unselection elements $G_{12}$ and $G_{13}$. However, it may be possible to ignore the influence of the disturbance since the bias voltage becomes the inversion bias. The bias voltage is not applied to both ends of the other unselection elements $G_{21}$ to $G_{23}$, and $G_{31}$ to $G_{33}$. Therefore, the disturbance does not occur.

When applying the bias voltage to the crossbar 2, the writing control circuit 4 short-circuits the feedback resistor $R_f$ included in the transimpedance amplifier 5 by the switch circuit $SW_3$. The feedback resistor $R_f$ operates as the voltage follower. Therefore, it may be possible to apply the bias voltage data to the lines $R_1$ to $R_3$ by the transimpedance amplifier 5 to perform the reading of the data. It may be possible to compact the configuration of the neural network circuit 1.

In addition, when writing and erasing the data, the writing control circuit 4 generates the bias voltage by barrel-shifting the data input to the DAC 3. Therefore, it may be possible to generate the bias voltage with a simple process.

(Other embodiments)

The number of bits of the DAC may be appropriately changed according to the individual design. Each bias voltage is not necessarily generated by the $DAC_3$, and an individual voltage output circuit may be employed.

Although the present disclosure is described based on the embodiments, the present disclosure is not limited to the embodiments or the configurations. Various changes and modifications may be made in the present disclosure. Furthermore, various combinations and modes, as well as other combinations and modes each obtained by adding only one or more elements to or removing any element from corresponding one of the various combinations and modes will fall within the scope and the ideological scope of the present disclosure.

The invention claimed is:

1. A neural network circuit comprising:
a storage part that includes memristors connected in a lattice shape, each of the memristors being a variable resistance element having a bipolar characteristic, wherein the memristors include a selection element and an unselection element;
a voltage application circuit that is configured to apply a bias voltage to the storage part;
a controller that is configured to control the voltage application circuit to perform to the selection element, at least one of writing, erasing, or reading of data, wherein the controller is configured to reduce a resistance value in performing the writing, the controller is configured to increase the resistance value in performing the erasing, and the controller is configured to increase the resistance value in performing the reading; and a plurality of conversion amplification circuits that are configured to convert a current flowing through at least one of the memristors into a voltage, and to output the voltage, wherein:
in performing at least one of the writing, the erasing, or the reading of the data to the selection element of the storage part, the controller varies the bias voltage and reduces disturbance to the unselection element;
a reference voltage is expressed by $V_{REF}$ and a writing voltage is expressed by $V_{SET}$;
in performing the writing of the data, the controller applies
a first voltage to a line connected with a first end of the selection element, the first voltage being expressed by $V_{REF}+V_{SET}$,
a second voltage to a line connected with a second end of the selection element, the second voltage being expressed by $V_{REF}-V_{SET}/2$,
a third voltage to a line in a side of the first end other than the line connected with the first end of the selection element, the third voltage being expressed by $V_{REF}-V_{SET}/4$, and
a fourth voltage to a line in a side of the second end other than the line connected with the second end of the selection element, the fourth voltage being expressed by $V_{REF}+V_{SET}/4$.

2. The neural network circuit according to claim 1, wherein:
an erasing voltage is expressed by $V_{RESET}$;
in performing the erasing of the data, the controller applies
a fifth voltage to the line connected with the first end of the selection element, the fifth voltage being expressed by $V_{REF}-V_{RESET}/2$,
a sixth voltage to the line connected with the second end of the selection element, the sixth voltage being expressed by $V_{REF}+V_{RESET}/2$, and
the reference voltage to a line other than the line connected with the first end of the selection element and the line connected with the second end of the selection element.

3. The neural network circuit according to claim 1, wherein:
the conversion amplification circuit includes a feedback resistor; and
in response to application of the bias voltage to the storage part, the controller causes the feedback resistor to be short-circuited, causing the feedback resistor to operate as a voltage follower.

4. The neural network circuit according to claim 1, wherein:
the voltage application circuit includes a digital-to-analog converter that is configured to set a polarity of an output voltage by 1 bit in input data; and
the controller generates the bias voltage by barrel-shifting the input data input to the digital-to-analog converter.

5. The neural network circuit according to claim 1, wherein:
an reading voltage is expressed by $V_{READ}$;
in performing the reading of the data, the controller applies
a seventh voltage to the line connected with the first end of the selection element,
the seventh voltage being expressed by $V_{REF}-V_{READ}$,
the reference voltage to the line connected with the second end of the selection element, and the reference voltage to the line other than the line connected with the first end of the selection element and the line connected with the second end of the selection element.

6. The neural network circuit according to claim 1, wherein:
the line in the side of the first end is arranged along a direction of the line connected with the first end; and
the line in the side of the second end is arranged along a direction of the line connected with the second end.

* * * * *